US 7,877,709 B2

(12) United States Patent
Itagaki

(10) Patent No.: US 7,877,709 B2
(45) Date of Patent: Jan. 25, 2011

(54) METHOD OF PLACING WIRES

(75) Inventor: Daishin Itagaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 336 days.

(21) Appl. No.: 12/048,791

(22) Filed: Mar. 14, 2008

(65) Prior Publication Data

US 2008/0233732 A1 Sep. 25, 2008

(30) Foreign Application Priority Data

Mar. 22, 2007 (JP) ............... 2007-074082

(51) Int. Cl.
*G06F 17/50* (2006.01)
(52) U.S. Cl. ............... 716/1; 716/10
(58) Field of Classification Search ............... 716/1, 716/10
See application file for complete search history.

(56) References Cited

U.S. PATENT DOCUMENTS 6,951,007 B2 * 9/2005 Kaida ............... 716/12
2004/0031010 A1 * 2/2004 Kaida ............... 716/12
2006/0190902 A1 * 8/2006 Shirai ............... 716/13

FOREIGN PATENT DOCUMENTS

JP 2974398 B2 9/1999

* cited by examiner

*Primary Examiner*—Jack Chiang
*Assistant Examiner*—Suchin Parihar
(74) *Attorney, Agent, or Firm*—Sughrue Mion, PLLC

(57) ABSTRACT

A method of placing wires for placing a shield wire with respect to a shield subject wire placed on a chip, a method includes setting a plurality of wire tracks on the chip, dividing the chip into at least a first area and a second area according to a division boundary, confirming whether the shield subject wire exists around the division boundary in the second area when the division boundary is not laid on top of the wire track, and determining whether to place the shield wire on a wire track being adjacent to division boundary in the first area based on the confirming.

16 Claims, 7 Drawing Sheets

US 7,877,709 B2

METHOD OF PLACING WIRES

BACKGROUND OF THE INVENTION

1. Field of the Invention

The present invention relates to a method of automatically placing wires in semiconductor integrated circuits and the like.

2. Description of Related Art

For semiconductor integrated circuits and the like, the automatic placement of wires in circuits is executed. This automatic placement is performed with use of a CAD program or the like running on a processer. In these years, as integrated circuits become larger in scale, the time required for this automatic placement of wires is increasing. Accordingly, in Japanese Patent No. 2974398 (hereinafter called reference 1), it is described that a plurality of processers are used to perform the automatic placement of wires in parallel.

In the technique described in reference 1, a wiring area is divided into a plurality of small areas, and automatic routing is performed for each small area in parallel processing. In the technique described in reference 1, the plurality of small areas where wires are placed are combined into a plurality of medium areas. Then, automatic routing of wires is further performed for each medium area in parallel processing. These medium areas are again divided into small areas, which are combined into a plurality of new medium areas different from the previous medium areas. Then, automatic wire routing is performed for the new medium areas. According to the automatic wire routing method described in reference 1, the division into small areas and the combination into medium areas are repeated to place wires, and hence it is difficult to sufficiently shorten the time required for placing wires.

Further, shield wires to prevent cross-talk noise may be placed adjacent to signal wires. The shield wires are placed adjacent to ones of signal wires already placed, which are likely to be affected by cross-talk noise to cause a problem. If also for these shield wires the above routing is performed, the time required until wire placement is determined may further increase.

As devices become larger in scale, the time required for placing wires increases. Further, even if a device is divided into a plurality of areas and wire routing is performed for each area in parallel processing, it is difficult to sufficiently shorten the time required for placing wires.

SUMMARY

In one embodiment, a method of placing wires for placing a shield wire with respect to a shield subject wire placed on a chip, a method includes setting a plurality of wire tracks on the chip, dividing the chip into at least a first area and a second area according to a division boundary, placing a first dummy terminal being placed in contact with the division boundary in the first area on a wire track being adjacent to the shield subject wire among the plurality of wire tracks, placing a second dummy terminal being placed in contact with the division boundary in the second area on a wire track being adjacent to the shield subject wire, placing a first shield wire connected to the first dummy terminal on a wire track being adjacent to the shield subject wire in the first area, and placing a second shield wire connected to the second dummy terminal on a wire track being adjacent to the shield subject wire in the second area.

In another embodiment, a method of placing wires for placing a shield wire with respect to a shield subject wire placed on a chip, a method includes setting a plurality of wire tracks on the chip, dividing the chip into at least a first area and a second area according to a division boundary, confirming whether the shield subject wire exists around the division boundary in the second area when the division boundary is not laid on top of the wire track, and determining whether to place the shield wire on a wire track being adjacent to division boundary in the first area based on the confirming.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
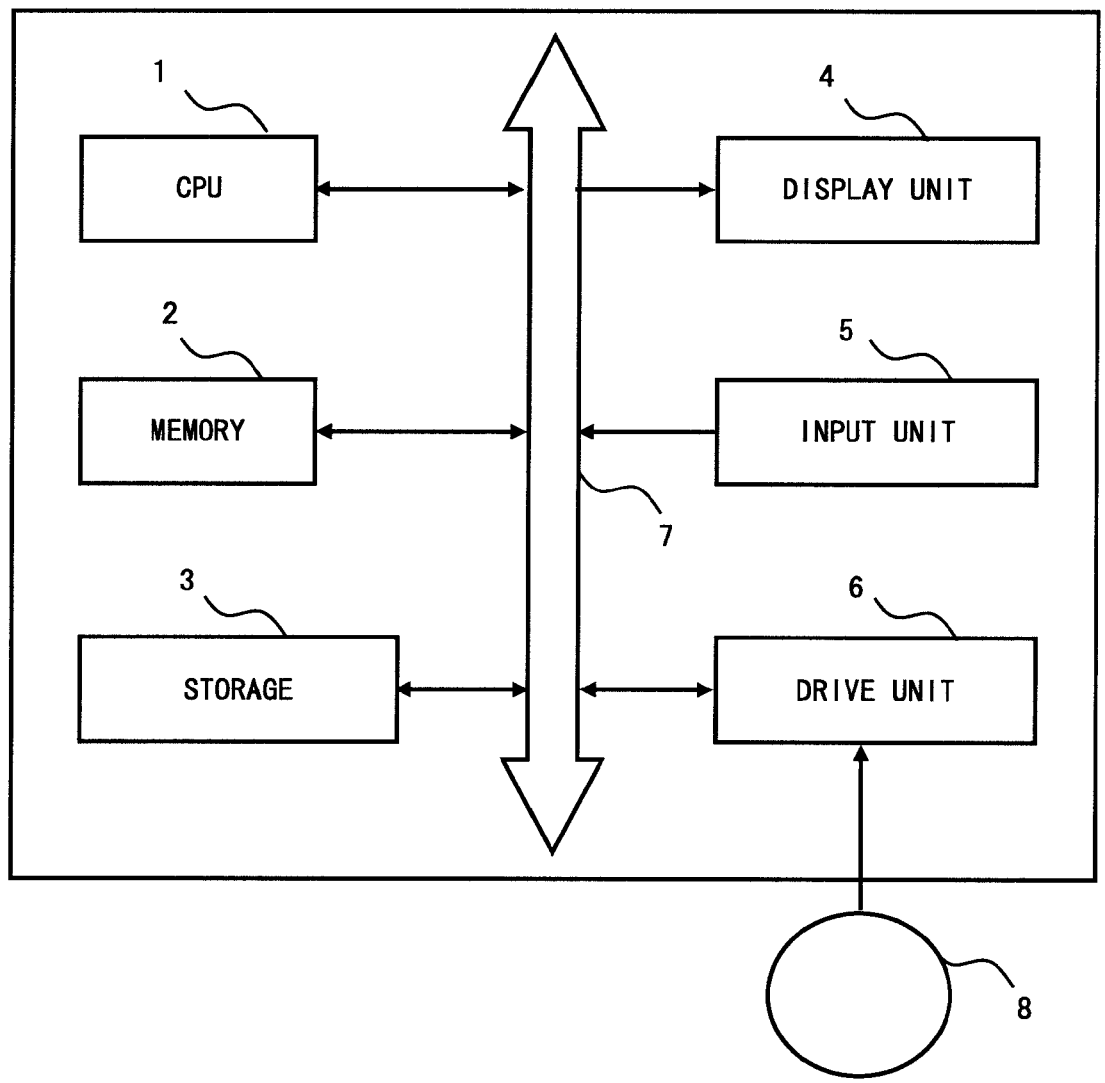
FIG. 1 is a schematic configuration diagram of a wire placing apparatus according to an embodiment of the present invention.

An embodiment of the present invention will be described in detail below with reference to the drawings. FIG. 1 shows a schematic configuration diagram of a wire placing system for carrying out wiring according to the present invention.

This system is constituted by a general CAD (Computer Aided design) apparatus. This computer 10 includes a central processing unit (hereinafter a CPU for short) 1, a memory 2, a storage 3, a display unit 4, an input unit 5, and a drive unit 6, which are connected to each other via a bus 7.

The CPU 1 executes programs using the memory 2 to perform various processes. Although FIG. 1 shows only the CPU 1, the computer of the present embodiment has multiple CPUs, which perform wiring in a plurality of areas described later in parallel. The memory 2 stores programs and data necessary to provide various processes. The memory 2 usually includes a cache memory, a system memory, and a display memory.

The display unit 4 is used to display layouts, parameter input screens, and the like and is embodied by a CRT, a LCD, a PDP, or the like. The input unit 5 is used by a user to enter requests, instructions, and parameters and is embodied by a keyboard, a mouse (not shown), or the like.

The storage 3 usually includes a magnetic disk unit, an optical disk unit, or a magneto optical disk unit. The storage 3 stores program data and files used in the processes for designing semiconductor devices such as automatic wire placement described later. The CPU 1 transfers program data to the memory 2 in response to an instruction through the input unit 5 and executes it.

The program data which is executed by the CPU 1 is provided by a record medium 8. The drive unit 6 drives the record medium 8 to access recorded contents therein. The CPU 1 reads the program data from the record medium 8 via the drive unit 6 and installs it in the storage 3.

The record medium 8 can be embodied by any computer-readable record medium such as a magnetic tape, a memory card, a floppy (registered trademark) disk, an optical disk, or a magneto optical disk. The above program data may be stored on the record medium 8 and be loaded into the memory 2 as needed for use.

The record medium 8 includes disk drive and a medium having recorded thereon program data uploaded or downloaded via a communication medium and further includes a record medium having recorded thereon programs which become executable after installed in another record medium (such as a hard disk) and a record medium having encrypted or compressed programs recorded thereon as well as a record medium having recorded thereon programs executable directly by a computer.

Figure 2:
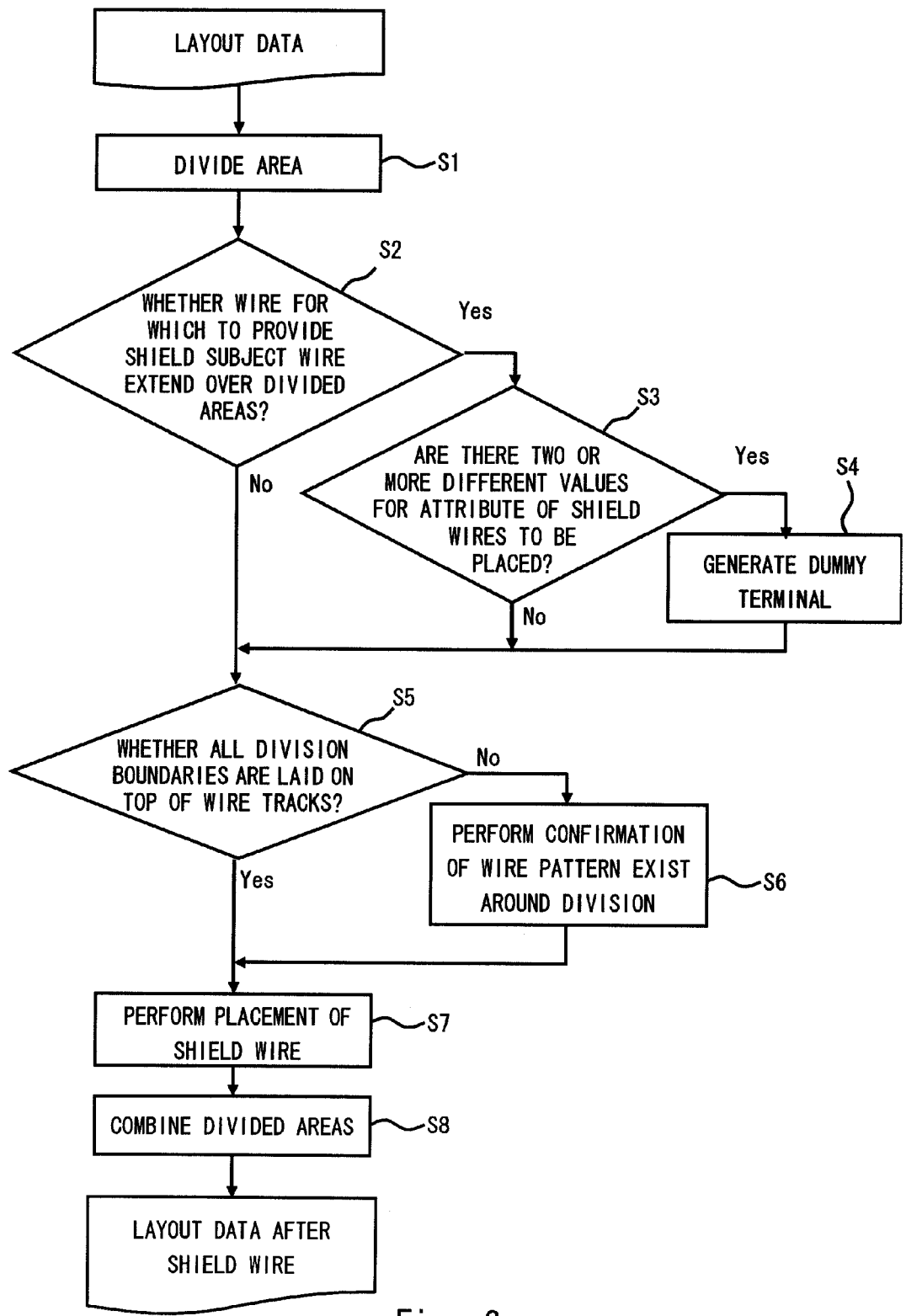
FIG. 2 is a flow chart of a wire placing method according to the embodiment.
Figure 3:
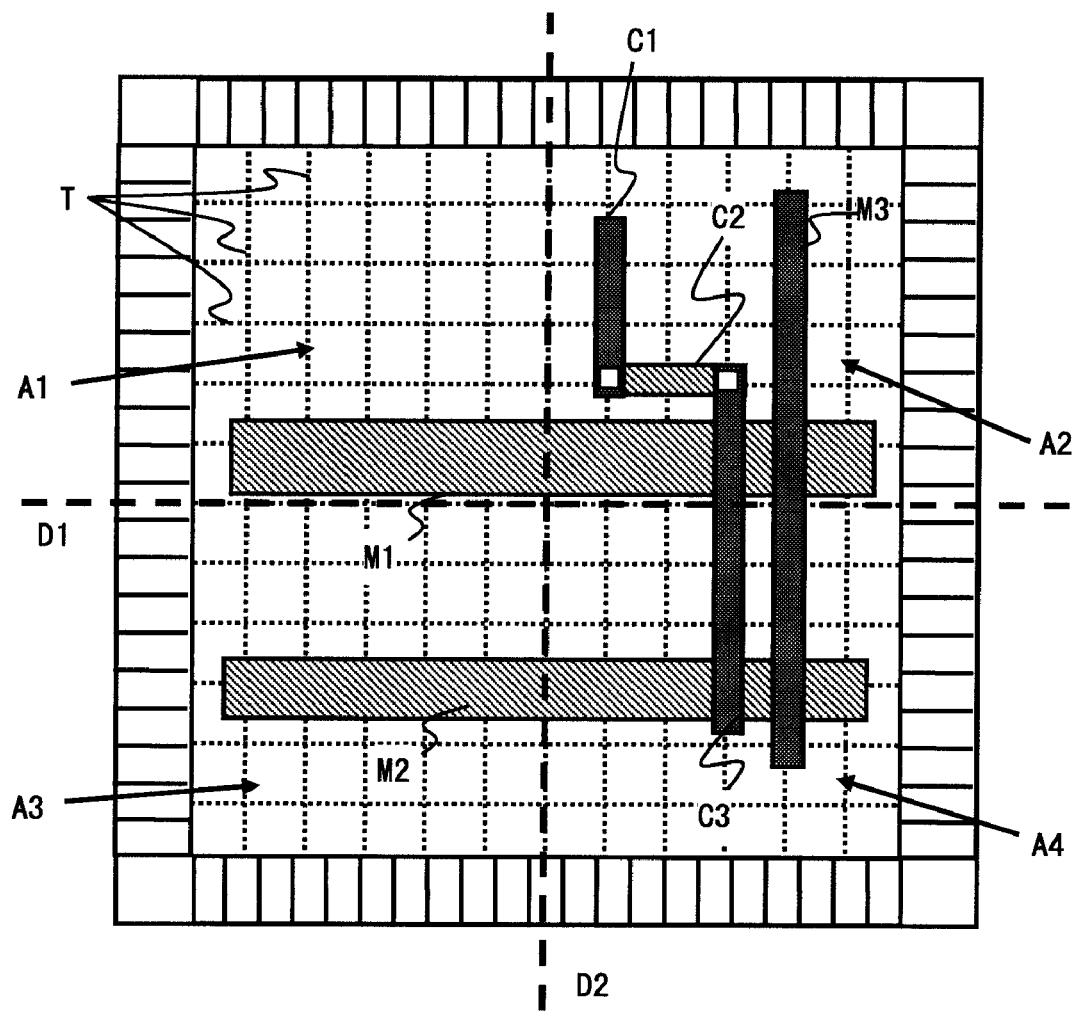
FIG. 3 is a schematic diagram of a semiconductor chip being processed according to the embodiment.

Next, the process flow of determining wire placement in a semiconductor device according to the present embodiment will be described. FIG. 2 is a flow chart showing the process executed by the automatic wire placing apparatus of the present embodiment. FIGS. 3 to 7 schematically show a semiconductor chip on which shield wires are being placed according to the present embodiment. The process illustrated in FIGS. 2 and 3 is executed by the wire placing system of FIG. 1.

FIG. 3 shows a state where an integrated circuit is already laid out using macros, etc., and power supply wires, signal wires connecting macros, and the like are already placed. Hence, layout data of the integrated circuit of FIG. 3 is already created. In the present embodiment, providing shield wires among signal wires of which the placement is already determined as needed in view of cross-talk noise, thus creating layout data will be described. The method of determining the placement of shield wires according to the present embodiment will be described using FIGS. 2, 3.

First, the circuit layout of FIG. 3 will be described. As shown in FIG. 3, a semiconductor device used in the present embodiment has wire layers C1, C3, M3 which extend vertically in the plane of FIG. 3 and wire layers M1, M2, C2 which extend laterally in the plane. In the figure, the wire layers extending laterally and the wire layers extending vertically are formed of different layers. In the example of FIG. 3, the wire layers extending vertically are formed above the wire layers extending laterally. The C1, C2, C3 are signal wires for transmitting signals, and the M1, M2, M3 are power supply wires for supplying a power supply VDD or ground GND. Here, the C1, C2, C3 are wire layers for transmitting the same signal, and hence C1 and C2, and C3 and C2 are connected via contacts (indicated by open squares in FIG. 3). In the present embodiment, wire tracks t are set in this layout data and are reference lines in placing wires. For example, by placing the center line of a wire to be placed along a wire track t, a minimum between-wire distance specified in design rules can be satisfied.

In the flow chart of FIG. 2, the layout data of FIG. 3 is inputted, and the placement of shield wires along wire tracks t starts. In the shield wire placement, the semiconductor chip is divided based on the entered layout data. For example, the semiconductor chip is divided into four areas A1 to A4 according to lines indicated by division boundaries D1, D2 in the layout data of FIG. 3 (step S1).

Then, it is determined whether a wire for which to provide a shield measure (hereinafter called a shield subject wire) extends over divided areas (step S2). In this example, the wires C1, C2, C3 are assumed to be shield subject wires. Because the wire C3 extends over the divided areas A2, A4, the process proceeds to step S3 according to the determination result at step S2.

At step S3, it is determined whether there are two or more different values for the attribute of shield wires to be placed. In this example, a shield wire having an attribute value of power supply is placed on the left of wire C1 in the figure, and a shield wire having an attribute value of ground is placed on the right of wire C1 and the left of wire C3 in the figure. Thus, the process proceeds to step S4 according to the determination result at step S3.

At step S4, dummy terminals are placed in contact with a division boundary, in a region for a shield wire extending over areas. The dummy terminal is for making, e.g., the CAD apparatus recognize it as a pseudo terminal and indicates the attribute of the shield wire and the coordinates of part of the shield wire in contact with the division boundary. After the completion of laying out, the dummy terminals are treated as part of the shield wire.

Figure 4:
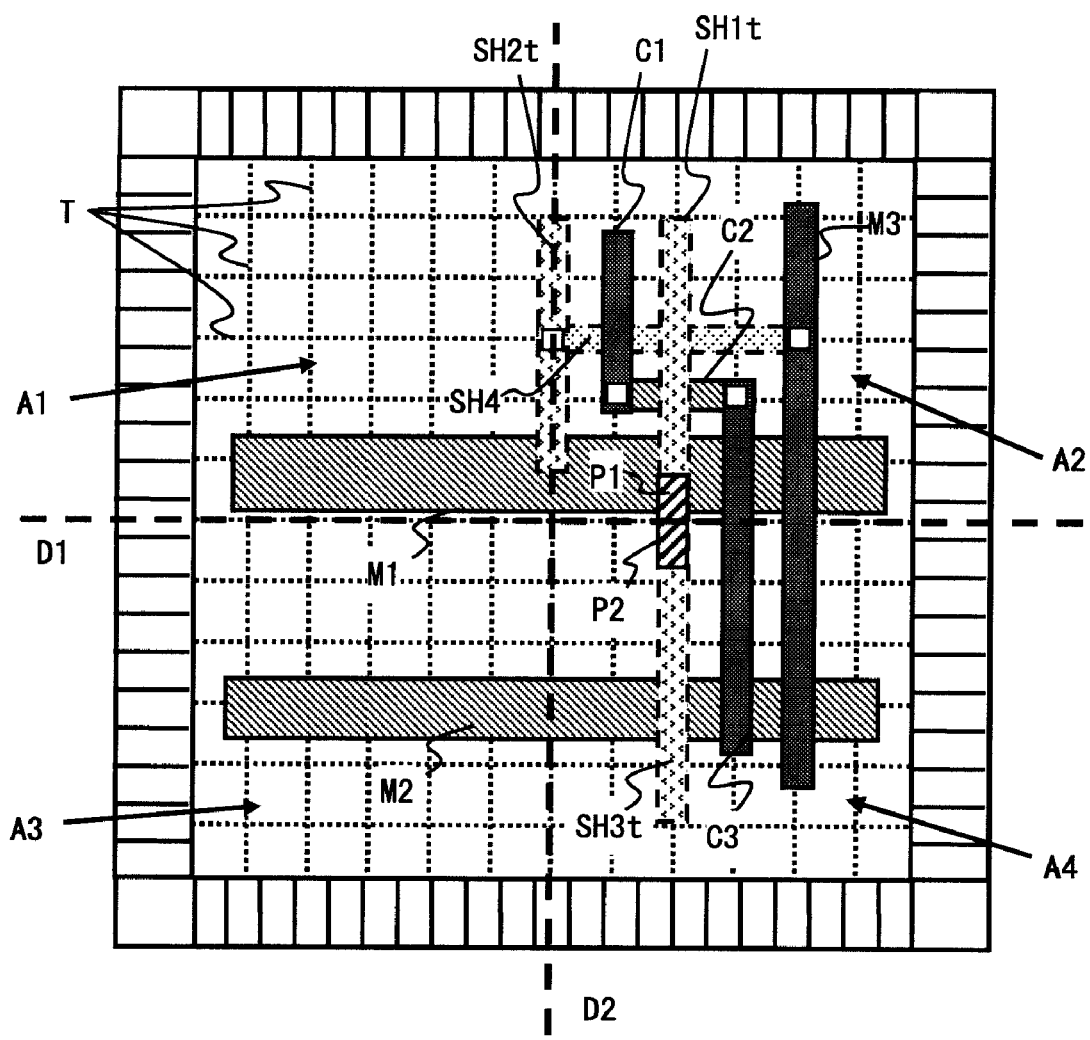
FIG. 4 is a schematic diagram of the semiconductor chip after the completion of step S4 according to the embodiment.

FIG. 4 shows a schematic diagram of the semiconductor chip after the completion of step S4. In FIG. 4, for explanation, the places to place shield wires on are denoted as shield wire-is-to-be-placed regions SH1t to SH3t. At steps S2, S3, no shield wire is generated, but the wire layers and attribute of shield wires are realized based on signal wires already placed. Then, at step S4, dummy terminals P1, P2 are set for the dummy wire extending over divided areas. The dummy terminal P1 is placed in contact with the division boundary D1, on the shield wire-is-to-be-placed region in the divided area A2. The dummy terminal P2 is placed in contact with the division boundary D1, on the shield wire-is-to-be-placed region in the divided area A4.

After the completion of step S4, the process proceeds to step S5. Also if it is determined that a shield subject wire does not extend over divided areas at step S2 and if it is determined that the attribute values of shield wires are the same, the process proceeds to step S5.

At step S5, it is determined whether all division boundaries are laid on top of wire tracks t. The wire tracks t are reference lines in placing wires. For example, by placing the center line of a wire to be placed along a wire track t, a minimum between-wire distance specified in design rules can be satisfied. Because the subsequent process is different depending on the determination result at step S5, the subsequent process will be described for each of the cases of the determination result at step S5.

Figure 5:
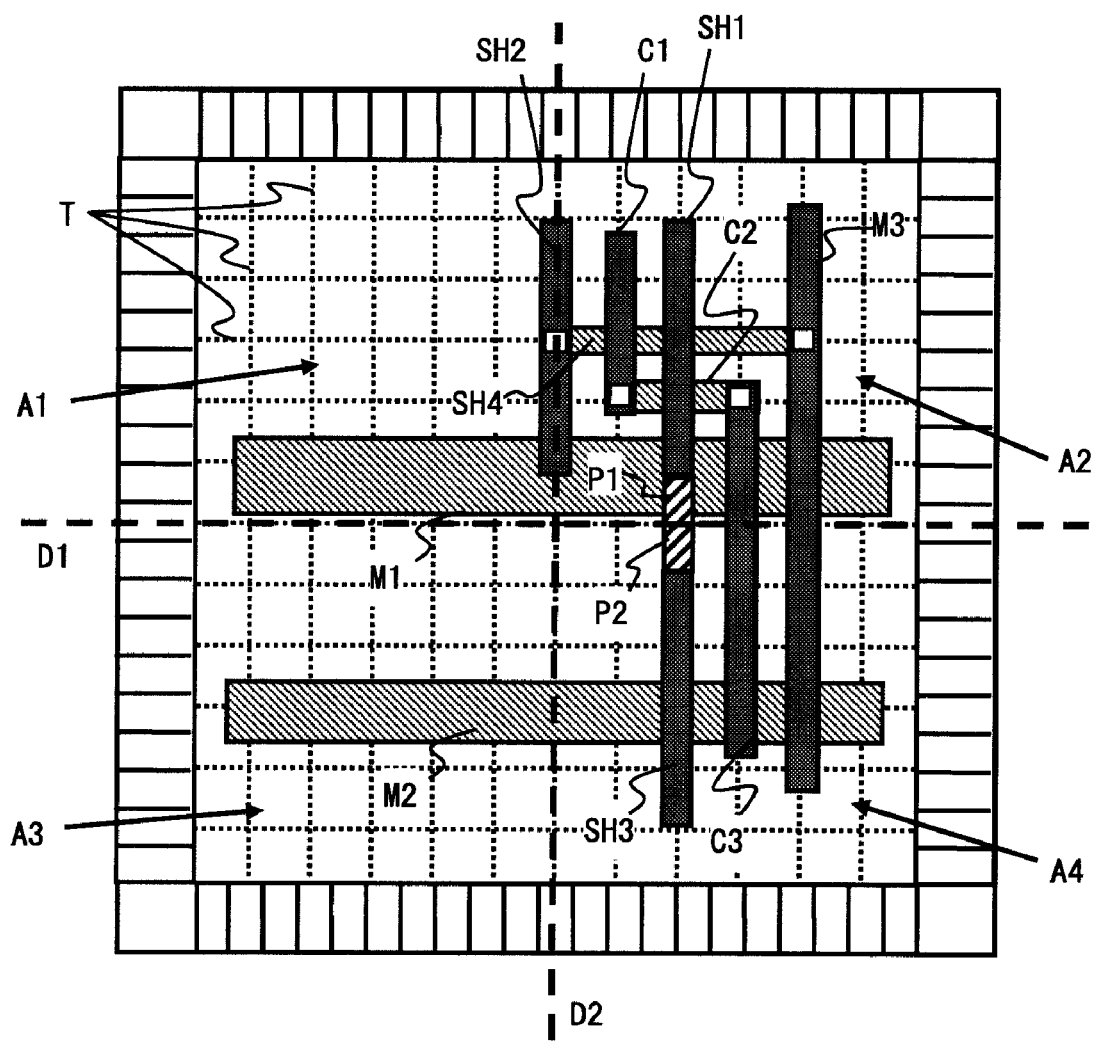
FIG. 5 is a schematic diagram of the semiconductor chip after the process up to step S8 is completed where all division boundaries are laid on top of wire tracks according to the embodiment.

First, the case where it is determined at step S5 that all division boundaries are laid on top of wire tracks t will be described. After the determination at step S5, at step S7 the placement of shield wires is performed in parallel for the divided areas, and at step S8 the divided areas into which the chip was divided at step S1 are combined. FIG. 5 shows a schematic diagram of the semiconductor chip after the combination. As shown in FIG. 5, a dummy wire SH2 is placed on the division boundary D2. Hence, at step S7 the dummy wire SH2 is generated in dummy wire placement for the divided area A2 where the corresponding shield subject wire C1 is placed. Further, a dummy wire SH1 is generated in dummy wire placement for the divided area A2, and a dummy wire SH3 is generated in dummy wire placement for the divided area A4. At this point, the dummy wires SH1, SH3 have the dummy terminals P1, P2 located in contact with the division boundary D1, which are placed at the joint of their dummy wires. Hence, in the combination at S8, the dummy wires SH1, SH3 are combined only by combining the divided areas.

Figure 6:
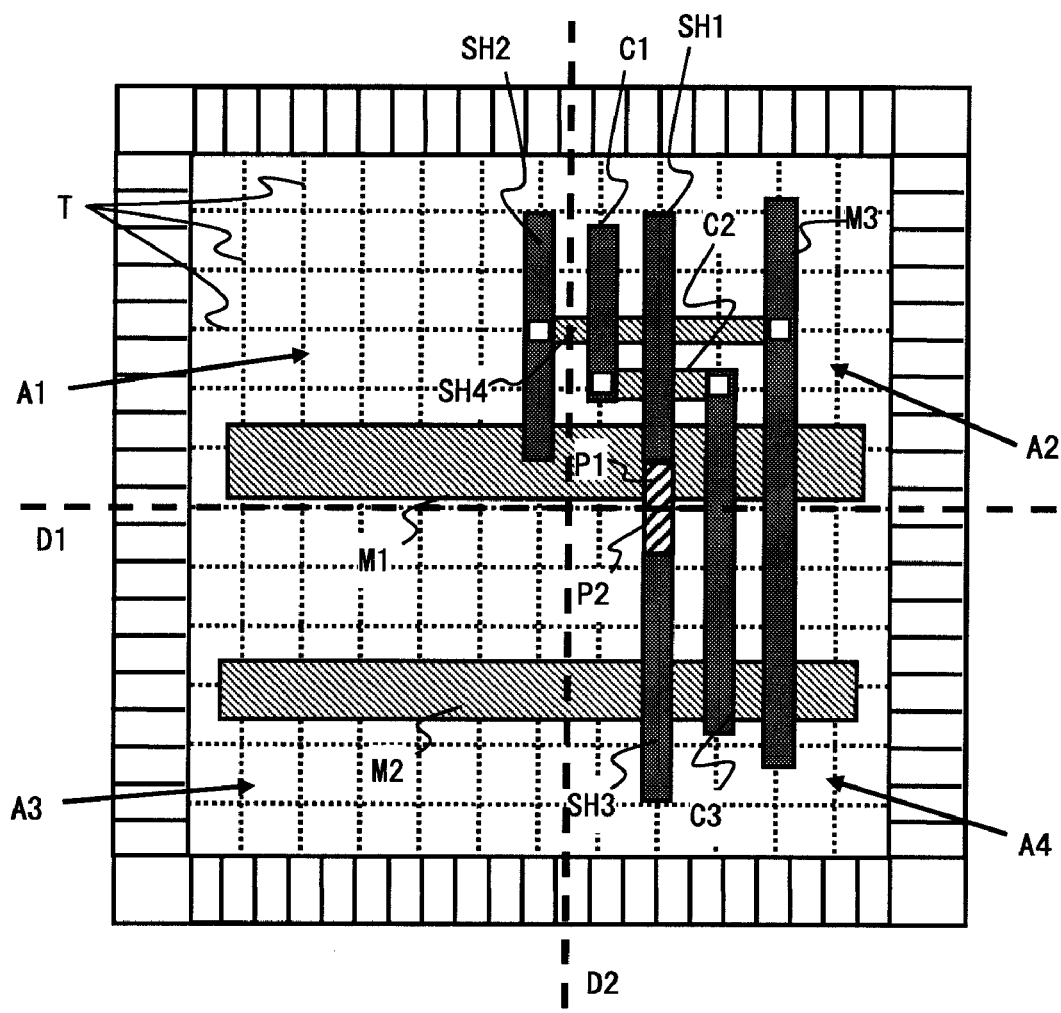
FIG. 6 is a schematic diagram of the semiconductor chip after the process up to step S8 is completed where a division boundary is not laid on top of a wire track according to the embodiment.

Next, the case where it is determined at step S5 that there is a division boundary not placed on a wire track t will be described. After the determination at step S5, at step S6 the confirmation of whether a wire pattern exists around a division boundary is performed. Then, after step S6 finishes, at step S7 the placement of shield wires is performed in parallel for the divided areas, and at step S8 the divided areas are combined. FIG. 6 shows a schematic diagram of the semiconductor chip produced at this point. As shown in FIG. 6, the dummy wire SH2 corresponding to wire C1 located in the divided area A2 is placed in the divided area A1. If there were not the confirmation at step S6, at step S7 the dummy wire SH2 would not be placed in the divided area A1 because a shield subject wire is not in the divided area A1. Hence, at step S6 it is confirmed whether a shield subject wire exists around the division boundary in an adjacent divided area. If a shield subject wire exists around the division boundary in a divided area adjacent thereto, a wire-is-to-be-placed region SH2$t$ for the shield wire SH2 is set in the divided area A1.

Figure 7:
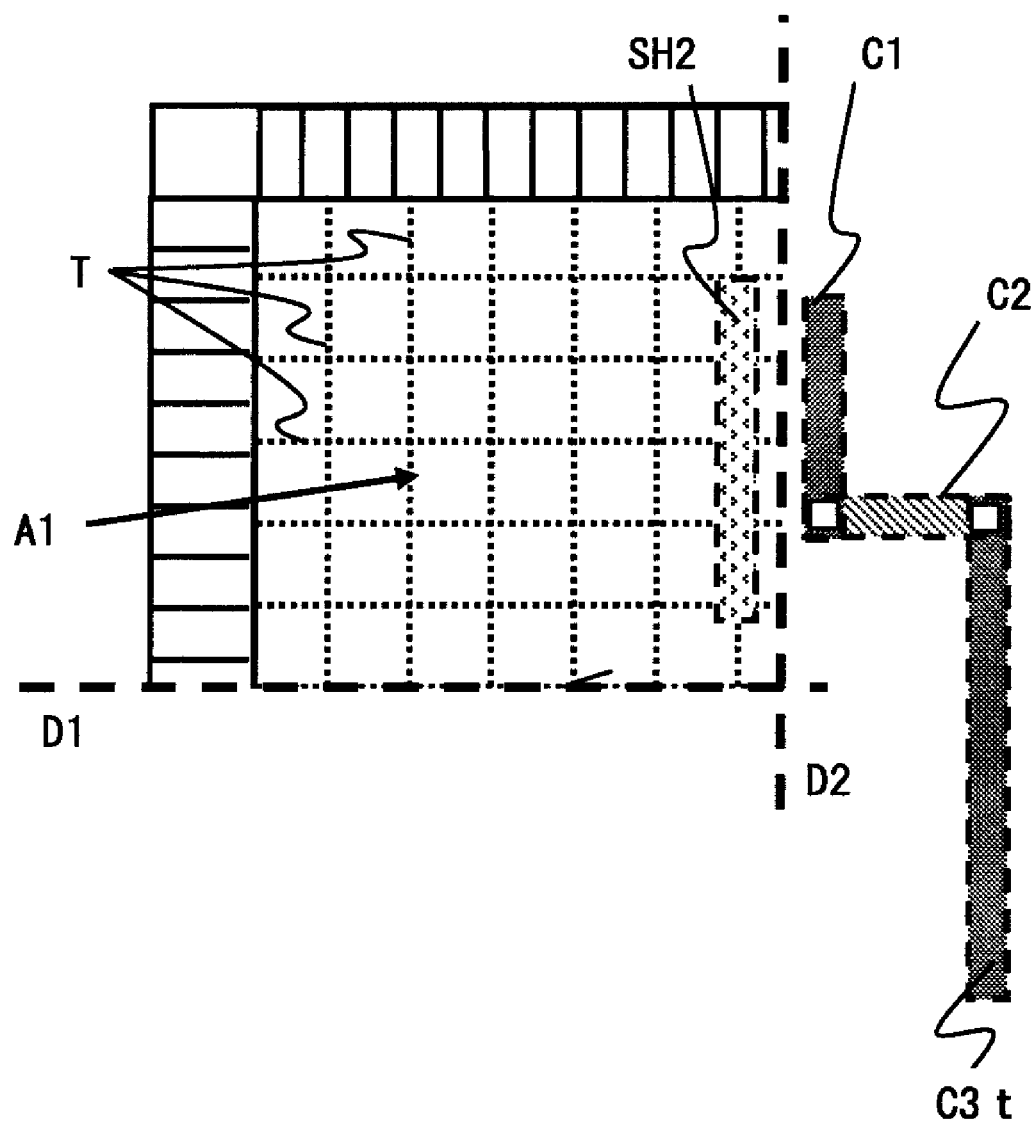
FIG. 7 is a schematic diagram of a divided area for illustrating the process of step S6 according to the embodiment.

Here, the process of step S6 will be described more specifically. FIG. 7 is a schematic diagram illustrating the confirmation at step S6. As shown in FIG. 7, in this example, a shield subject wire is not in the divided area A1, but the shield subject wire C1 is located within one track from the division boundary D2 of the divided area A1 (in the present embodiment the distance between adjacent wire tracks t is taken as a unit called a track). Accordingly, the divided area A1 is made to recognize a pseudo shield subject wire C1. That is, at step S6 a shield subject wire located within one track from a division boundary is searched for, and if such a shield subject wire is found, the divided area being processed is made to recognize the found shield subject wire.

At step S7, in dummy wire placement for the divided area A1, the dummy wire SH2 is generated based on the shield subject wire C1 recognized a pseudo wire. The dummy wire SH1 is generated in dummy wire placement for the divided area A2. The dummy wire SH3 is generated in dummy wire placement for the divided area A4. Then, in the combination at step S8, the dummy wires SH1 and SH3 are combined only by combining the divided areas.

As described above, in the placement apparatus and method according to the present embodiment, a dummy terminal is placed in contact with a division boundary, on a shield wire extending over divided areas. Then, in the divided area where the dummy terminal is placed, the shield wire is placed such that an end thereof is connected to the dummy terminal. By this means, shield wires individually generated in the respective divided areas can be connected correctly simply by combining the divided areas. That is, with the placement apparatus and method according to the present embodiment, when placing shield wires in a plurality of divided areas in parallel processing with use of multiple CPUs, shield wires extending over divided areas can be placed without return processing. Thus, the design time required for laying out can be decreased.

Further, in the placement apparatus and method according to the present embodiment, at the above step S6 it is confirmed whether a wire pattern exists around a division boundary. Without the confirmation at step S6, a shield wire would not be generated on a divided area unless a shield subject wire exists on the divided area because the divided areas are processed in parallel by respective CPUs, and hence, missing the placement of the shield wire around the division boundary would occur. In contrast, in the present embodiment, step S6 is executed, so that if a shield subject wire exists around a division boundary in an adjacent divided area, the divided area being processed is made to recognize the shield subject wire in the adjacent divided area. By this means, shield wires around division boundaries can be generated without return processing even if no shield subject wire exists on the divided area. Further, missing the placement of a shield wire around a division boundary can be prevented.

By using the placement apparatus and method according to the present embodiment, the following shield wire placement process becomes possible. For example, after shield wires are placed close to each other with use of the placement apparatus and method according to the present embodiment, the shield wires are removed. That is, by placing shield wires in an entire area designated as a wiring forbidden area and finally removing the shield wires, the wiring forbidden area can be set arbitrarily with using an automatic placement and routing.

It is apparent that the present invention is not limited to the above embodiments, but may be modified and changed without departing from the scope and spirit of the invention.

What is claimed is:

1. A computer implemented method of placing a shield wire with respect to a shield subject wire placed on a chip, a method comprising using a computer:
    setting a plurality of wire tracks on the chip;
    dividing the chip into at least a first area and a second area according to a division boundary;
    placing a first dummy terminal in contact with the division boundary in the first area on a wire track adjacent to the shield subject wire among the plurality of wire tracks;
    placing a second dummy terminal in contact with the division boundary in the second area on a wire track adjacent to the shield subject wire;
    placing a first shield wire connected to the first dummy terminal on a wire track adjacent to the shield subject wire in the first area; and
    placing a second shield wire connected to the second dummy terminal on a wire track adjacent to the shield subject wire in the second area,
    wherein a placement of the first shield wire and a placement of the second shield wire are performed in parallel by different CPUs(Central Processing Units).

2. The method of placing wires according to claim 1 wherein the dummy terminal is set to same wire layer as the shield wire.

3. The method of placing wires according to claim 2 wherein a placement of the first shield wire and a placement of the second shield wire are performed in parallel.

4. The method of placing wires according to claim 1 wherein a placement of the dummy terminal is performed based on an attribute of the shield wire with respect to the shield subject wire.

5. The method of placing wires according to claim 2 wherein a placement of the dummy terminal is performed based on an attribute of the shield wire with respect to the shield subject wire.

6. The method of placing wires according to claim 1 wherein a placement of the dummy terminal is performed based on an attribute of the shield wire with respect to the shield subject wire.

7. The method of placing wires according to claim 1 further comprising:
    confirming whether the shield subject wire exists around a division boundary in an area when the division boundary is not laid on top of a wire track; and determining whether to place the shield wire on a wire track adjacent to the division boundary in an adjacent area based on the confirming.

8. The method of placing wires according to claim 2 further comprising:
   confirming whether the shield subject wire exists around a division boundary in an area when the division boundary is not laid on top of a wire track; and
   determining whether to place the shield wire on a wire track adjacent to the division boundary in an adjacent area based on the confirming.

9. The method of placing wires according to claim 1 further comprising:
   confirming whether the shield subject wire exists around a division boundary in an area when the division boundary is not laid on top of a wire track; and
   determining whether to place the shield wire on a wire track adjacent to the division boundary in an adjacent area based on the confirming.

10. The method of placing wires according to claim 4 further comprising:
    confirming whether the shield subject wire exists around a division boundary in an area when the division boundary is not laid on top of a wire track; and
    determining whether to place the shield wire on a wire track adjacent to the division boundary in an adjacent area based on the confirming.

11. The method of placing wires according to claim 1 wherein a placement of the first shield wire and a placement of the second shield wire are performed in parallel, and a shield wire on the chip is determined by combining data of a shield wire placed in the first area and data of a shield wire placed in the second area.

12. The method of placing wires according to claim 2 wherein a placement of the first shield wire and a placement of the second shield wire are performed in parallel, and a shield wire on the chip is determined by combining data of a shield wire placed in the first area and data of a shield wire placed in the second area.

13. The method of placing wires according to claim 1 wherein a placement of the first shield wire and a placement of the second shield wire are performed in parallel, and a shield wire on the chip is determined by combining data of a shield wire placed in the first area and data of a shield wire placed in the second area.

14. The method of placing wires according to claim 4 wherein a placement of the first shield wire and a placement of the second shield wire are performed in parallel, and a shield wire on the chip is determined by combining data of a shield wire placed in the first area and data of a shield wire placed in the second area.

15. The method of placing wires according to claim 7 wherein a placement of the first shield wire and a placement of the second shield wire are performed in parallel, and a shield wire on the chip is determined by combining data of a shield wire placed in the first area and data of a shield wire placed in the second area.

16. A computer implemented method of placing a shield wire with respect to a shield subject wire placed on a chip, comprising using a computer for:
    setting a plurality of wire tracks on the chip;
    dividing the chip into at least a first area and a second area according to a division boundary;
    confirming whether the shield subject wire exists around the division boundary in the second area when the division boundary is not laid on top of the wire track and
    determining whether to place the shield wire on a wire track adjacent to the division boundary in the first area based on the confirming
    wherein the confirming and the determining with respect to the first area and the second area are performed in parallel by different CPUs(Central Processing Units).

* * * * *